(12) United States Patent
Kim

(10) Patent No.: US 11,604,527 B2
(45) Date of Patent: *Mar. 14, 2023

(54) TOUCH SENSOR AND DISPLAY DEVICE INCLUDING TOUCH SENSOR

(71) Applicant: Samsung Display Co., Ltd., Yongin-si (KR)

(72) Inventor: Do Ik Kim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/506,612

(22) Filed: Oct. 20, 2021

(65) Prior Publication Data

US 2022/0043526 A1 Feb. 10, 2022

Related U.S. Application Data

(63) Continuation of application No. 15/831,849, filed on Dec. 5, 2017, now Pat. No. 11,175,761.

(30) Foreign Application Priority Data

Dec. 5, 2016 (KR) .......................... 10-2016-0164622

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *G01R 27/2605* (2013.01);
(Continued)

(58) Field of Classification Search
CPC .... G06F 3/0412; G06F 3/0446; G06F 3/0418; G06F 3/0448; G06F 3/05;
(Continued)

(56) References Cited

U.S. PATENT DOCUMENTS 8,536,880 B2  9/2013 Philipp
9,244,573 B2  1/2016 Ryu et al.
(Continued)

FOREIGN PATENT DOCUMENTS

KR  10-2015-0103952 A  9/2015
KR     10-1620463 B1   5/2016
(Continued)

OTHER PUBLICATIONS

Chaniotakis, Operational Amplifiers, 2006, pp. 18-19 (Year:2006).

*Primary Examiner* — Douglas M Wilson
(74) *Attorney, Agent, or Firm* — Innovation Counsel LLP

(57) ABSTRACT

A display device may include a display panel, a sensor unit, and a touch driver. The sensor unit is provided on the display panel and may output a sensing signal corresponding to a touch input. The sensor unit may include a first electrode and may include a conductive layer provided between the display panel and the first electrode and spaced from the first electrode. The touch driver may include a signal receiver. The signal receiver may include a first input terminal electrically coupled to the first electrode, may include a second input terminal electrically coupled to the conductive layer, may receive the sensing signal, and may output a signal corresponding to a voltage difference the first input terminal and the second input terminal.

20 Claims, 10 Drawing Sheets

(51) Int. Cl.
  *G01R 27/26* (2006.01)
  *G06F 3/05* (2006.01)
(52) U.S. Cl.
  CPC .......... *G06F 3/0418* (2013.01); *G06F 3/0448* (2019.05); *G06F 3/05* (2013.01); *G06F 2203/04111* (2013.01); *G06F 2203/04112* (2013.01)
(58) Field of Classification Search
  CPC .. G06F 2203/04111; G06F 2203/04112; G06F 3/0443; G06F 3/0445; G06F 2203/04103; G06F 2203/04106; G06F 2203/04107; G06F 3/041; G01R 27/2605
  See application file for complete search history.

(56) References Cited

U.S. PATENT DOCUMENTS

| | | | |
|---|---|---|---|
| 10,120,520 B2* | 11/2018 | Krah | G06F 3/044 |
| 10,359,899 B2 | 7/2019 | Naganuma et al. | |
| 2008/0155289 A1 | 6/2008 | Fernald et al. | |
| 2010/0079401 A1 | 4/2010 | Staton | |
| 2012/0054379 A1 | 3/2012 | Leung et al. | |
| 2012/0062499 A1* | 3/2012 | Weaver | G06F 3/0446 345/174 |
| 2014/0125357 A1 | 5/2014 | Blondin et al. | |
| 2016/0380660 A1 | 12/2016 | Polley et al. | |
| 2018/0059864 A1 | 3/2018 | Pham et al. | |
| 2018/0059869 A1* | 3/2018 | Ma | G06F 3/0447 |
| 2018/0136778 A1 | 5/2018 | Choi et al. | |
| 2018/0210593 A1 | 7/2018 | Kurasawa et al. | |
| 2018/0224984 A1 | 8/2018 | Kim et al. | |
| 2018/0301981 A1 | 10/2018 | Yau | |
| 2018/0321793 A1 | 11/2018 | Kim et al. | |
| 2018/0329555 A1 | 11/2018 | Kim et al. | |
| 2018/0329576 A1 | 11/2018 | Kim et al. | |
| 2019/0050085 A1* | 2/2019 | Naganuma | G06F 3/0445 |

FOREIGN PATENT DOCUMENTS

| | | |
|---|---|---|
| KR | 10-2018-0090936 A | 8/2018 |
| KR | 10-2018-0122761 A | 11/2018 |
| KR | 10-2018-0125671 A | 11/2018 |
| KR | 10-2018-0125672 A | 11/2018 |

* cited by examiner

TOUCH SENSOR AND DISPLAY DEVICE
INCLUDING TOUCH SENSOR

CROSS-REFERENCE TO RELATED APPLICATION(S)

This application is a continuation application of U.S. patent application Ser. No. 15/831,849 filed Dec. 5, 2017, which claims priority to Korean patent application no. 10-2016-0164622 filed on Dec. 5, 2016; the entire disclosure of the Korean patent application is incorporated herein in its entirety by reference.

BACKGROUND

Field

The technical field is related to a touch sensor and a display device including the touch sensor.

Description of Related Art

A touch sensor is a kind of information input device and may be provided in a display device. For example, the touch sensor may be attached to one surface of a display panel of a display device or manufactured integrally with a display panel of a display device. A user may watch an image displayed on a screen of a display device and press or touch the touch sensor to input information.

SUMMARY

Embodiments are related to a touch sensor having a substantially high sensitivity. Embodiments are related to a display device including the touch sensor.

An embodiment may be related to a display device including the following elements: a display panel; a sensor unit comprising a first electrode provided on a region of the display panel and configured to output a sensing signal corresponding to a touch input, and a conductive layer provided between the display panel and the first electrode at a position spaced apart from the first electrode; and a touch driver comprising a signal receiver configured to receive the sensing signal and detect the touch input in response to the sensing signal. The signal receiver may include a first input terminal electrically coupled to the first electrode, and a second input terminal electrically coupled to the conductive layer, and may output a signal corresponding to a difference in voltage between the first input terminal and the second input terminal.

In an embodiment, the second input terminal may be a ground terminal of the signal receiver.

In an embodiment, the touch driver may include a ground terminal electrically coupled to the second input terminal.

In an embodiment, the touch driver may further include a digital analog converter and a signal processor, each of which includes a reference voltage terminal electrically coupled to the ground terminal.

In an embodiment, the display device may further include a buffer electrically coupled between the conductive layer and the second input terminal.

In an embodiment, the conductive layer may include: a plurality of electrode parts configured to overlap the first electrode; and a connection line configured to electrically couple the electrode parts with each other.

In an embodiment, the electrode parts and the connection line may be integrally coupled with each other.

In an embodiment, the sensor unit may include: a plurality of first sensing cells configured to form the first electrode, and a plurality of first connectors configured to electrically couple the first sensing cells included in the first electrode; and a second electrode comprising a plurality of second sensing cells spaced apart from the first sensing cells, and a plurality of second connectors configured to electrically couple the second sensing cells with each other.

In an embodiment, the first sensing cells, the first connectors, and the second sensing cells may be disposed on a first layer of the sensor unit. The second connectors and the conductive layer may be spaced apart from each other and disposed on a second layer separated from the first layer with at least one insulating layer interposed between the first layer and the second layer.

In an embodiment, the electrode parts may have shapes and areas corresponding to the first sensing cells and be disposed to overlap the first sensing cells.

In an embodiment, the display device may further include a power supply configured to supply a first voltage and a second voltage respectively to a first power terminal and a second power terminal of the touch driver.

In an embodiment, the second power terminal may be electrically coupled to the second input terminal.

In an embodiment, the power supply may include: a power input terminal; an inductor electrically coupled between the power input terminal and the first power terminal; and a capacitor electrically coupled between the first power terminal and the second power terminal.

In an embodiment, the power supply may include: a power input terminal; a low dropout regulator IC electrically coupled between the power input terminal and the first power terminal, and including a reference voltage terminal electrically coupled to the second power terminal; and a capacitor electrically coupled between the first power terminal and the second power terminal.

An embodiment may be related to a touch sensor including the following elements: a sensor unit comprising a first electrode, and a conductive layer spaced apart from the first electrode and including at least a region overlapping the first electrode; and a touch driver configured to receive a sensing signal from the first electrode and detect a touch input. The touch driver may include a signal receiver including a first input terminal electrically coupled to the first electrode, and a second input terminal electrically coupled to the conductive layer. The signal receiver may be configured to output a signal corresponding to a difference in voltage between the first input terminal and the second input terminal.

In an embodiment, the touch driver may include: a first power terminal configured to receive a first voltage; and a second power terminal configured to receive a second voltage. The second power terminal may be a ground terminal electrically coupled to the conductive layer.

In an embodiment, the touch sensor may further include a buffer electrically coupled between the conductive layer and the second power terminal.

In an embodiment, the sensor unit may include: a plurality of first sensing cells configured to form the first electrode and disposed on a first layer of the sensor unit, and a plurality of first connectors configured to electrically couple the first sensing cells included in the first electrode and disposed on the first layer; and a second electrode comprising a plurality of second sensing cells disposed on the first layer and spaced apart from the first sensing cells, and a plurality of connectors configured to electrically couple the second sensing cells and disposed on a second layer different from the first layer.

In an embodiment, the conductive layer may include: a plurality of electrode parts disposed on the second layer and configured to overlap the first sensing cells, the electrode parts being spaced apart from the second connectors; and a connection line disposed on the second layer and spaced apart from the second connectors, the connection line being configured to electrically couple the electrode parts with each other.

An embodiment may be related to a display device. The display device may include a display panel, a sensor unit, and a touch driver. The sensor unit may be provided on the display panel and may output a sensing signal corresponding to a touch input. The sensor unit may include a first electrode and may include a conductive layer provided between the display panel and the first electrode and spaced from the first electrode. The touch driver may include a signal receiver. The signal receiver may include a first input terminal electrically coupled to the first electrode, may include a second input terminal electrically coupled to the conductive layer, may receive the sensing signal, and may output a signal corresponding to a voltage difference the first input terminal and the second input terminal.

The second input terminal may be a ground terminal.

The touch driver may include a ground terminal electrically coupled to the second input terminal.

The touch driver may include the following elements: a digital analog converter including a first reference voltage terminal; and a signal processor including a second reference voltage terminal. Each of the first reference voltage terminal and the second reference voltage terminal may be electrically coupled to the ground terminal.

The display device may include a buffer. The conductive layer may be electrically coupled through the buffer to the second input terminal.

The conductive layer may include the following elements: a first conductive part overlapping the first electrode; a second conductive part; and a connection line electrically coupling the first conductive part with the second conductive part.

The first conductive part, the second conductive part, and the connection line may be formed of a same material and have a same thickness.

The sensor unit may include the following elements: a plurality of first-type electrodes including the first electrode; a plurality of first-type connectors electrically coupling the first-type electrodes; a plurality of second-type electrodes spaced from the first-type electrodes; and a plurality of second-type connectors electrically coupling the second-type electrodes, the second-type connectors respectively intersecting the first-type connectors.

The sensor unit may include an insulating layer. The first-type electrodes, the first-type connectors, and the second-type electrodes may directly contact a first face of the insulating layer. The second-type connectors and the conductive layer may be spaced from each other, may directly contact the insulating layer, and may be spaced from the first face of the insulating layer.

The first conductive part may have edges slanted with respect to the connection line and respectively corresponding and parallel to edges of the first electrode.

The display device may include a power supply electrically connected to the touch driver and configured to supply a first voltage and a second voltage respectively to a first power terminal and a second power terminal of the touch driver.

The second power terminal may be electrically coupled to the second input terminal.

The power supply may include the following elements: a power input terminal; an inductor electrically coupled between the power input terminal and the first power terminal; and a capacitor having a first capacitor terminal and a second capacitor terminal respectively electrically connected to the first power terminal and the second power terminal.

The power supply may include the following elements: a power input terminal; a regulator integrated circuit electrically coupled between the power input terminal and the first power terminal, and including a reference voltage terminal electrically coupled to the second power terminal; and a capacitor electrically having a first capacitor terminal and a second capacitor terminal respectively electrically connected to the first power terminal and the second power terminal.

An embodiment may be related to a touch sensor. The touch sensor may include the following elements: a sensor unit may include a first electrode and a conductive layer, the conductive layer being spaced from the first electrode and overlapping the first electrode; and a touch driver including a signal receiver. The signal receiver may include a first input terminal electrically coupled to the first electrode, may include a second input terminal electrically coupled to the conductive layer, may receive a sensing signal from the sensor unit, and may output a signal corresponding to a voltage difference between the first input terminal and the second input terminal.

The touch driver may include the following elements: a first power terminal configured to receive a first voltage; and a second power terminal configured to receive a second voltage. The second power terminal may be a ground terminal electrically coupled to the conductive layer.

The touch sensor may include a buffer. The conductive layer may be electrically connected through the buffer to the second power terminal.

The sensor unit may include the following elements: an insulating layer; a plurality of first-type electrodes including the first electrode and disposed directly on a first face of the insulating layer; a plurality of first-type connectors electrically coupling the first-type electrodes and disposed directly on the first face of the insulating layer; a plurality of second-type electrodes disposed directly on the first face of the insulating layer and spaced from the first-type electrodes; and a plurality of second-type connectors electrically coupling the second-type electrodes and spaced from the first face of the insulating layer.

The conductive layer may include the following elements: a plurality of conductive parts disposed directly on the insulating layer, spaced from the first face of the insulating layer, overlapping the first-type electrodes, and spaced from the second-type connectors; and one or more connection lines disposed directly on the insulating layer, spaced from the first face of the insulating layer, spaced from the second-type connectors, and electrically coupling the conductive parts with each other.

A material of the conductive layer may be identical to a material of the second-type connectors. A thickness of the conductive layer is equal to a thickness of the second-type connectors in a direction perpendicular to the first face of the insulating layer.

DETAILED DESCRIPTION

Figure 1:
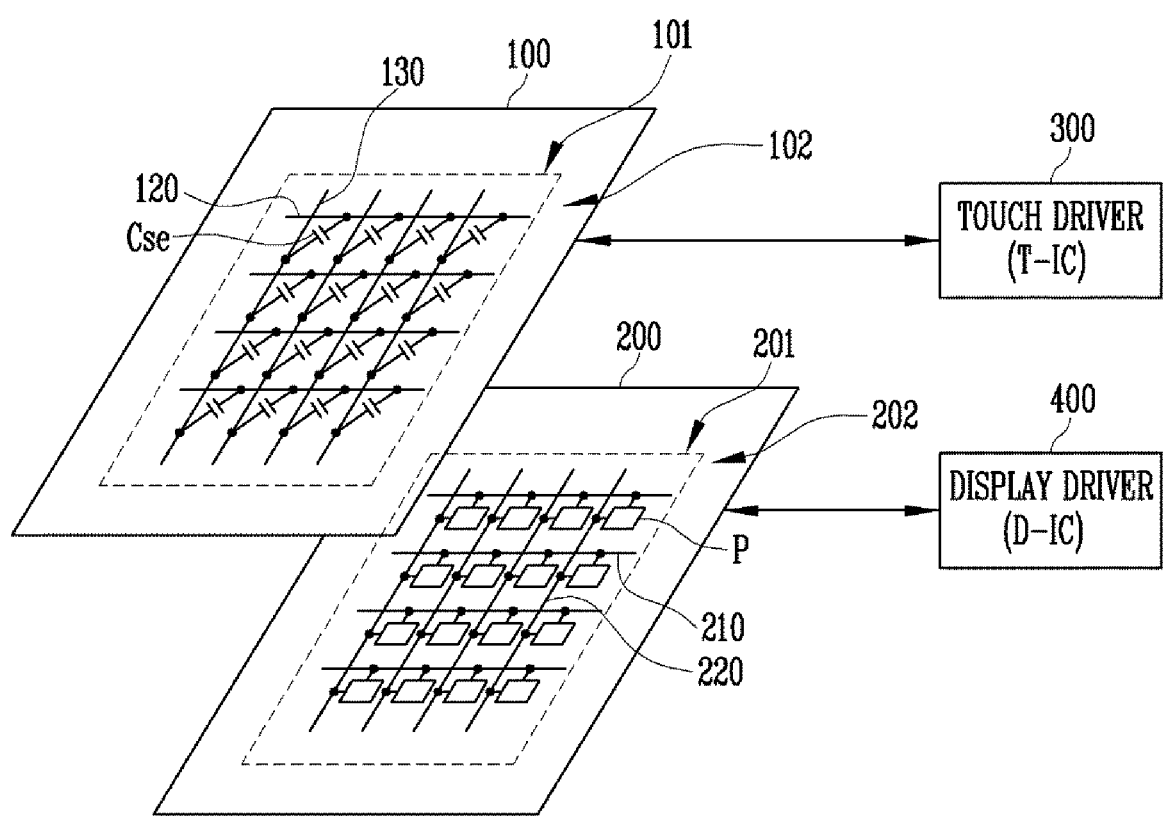
FIG. 1 is a schematic diagram illustrating a display device in accordance with an embodiment.

Example embodiments are described with reference to the accompanying drawings. Variations from the shapes of the illustrations as a result, for example, of manufacturing techniques, and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings may denote like elements.

Terms such as 'first' and 'second' may be used to describe various components, but they should not limit the various components. Those terms are used for the purpose of differentiating a component from other components. For example, a first component may be referred to as a second component, and a second component may be referred to as a first component and so forth. For conciseness, the terms "first", "second", etc. may represent "first-type (or first-set)", "second-type (or second-set)", etc., respectively. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements may exist or may be added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" may refer to one component directly or indirectly coupled to another component. On the other hand, "directly connected/directly coupled" may refer to one component directly coupled another component without an intermediate component.

The term "sectional view" may mean "cross-sectional view". The term "electrode" may mean "electrode set" (with interconnected electrodes). The term "sensing cell" may mean "sensing electrode" or "electrode".

Figure 2:
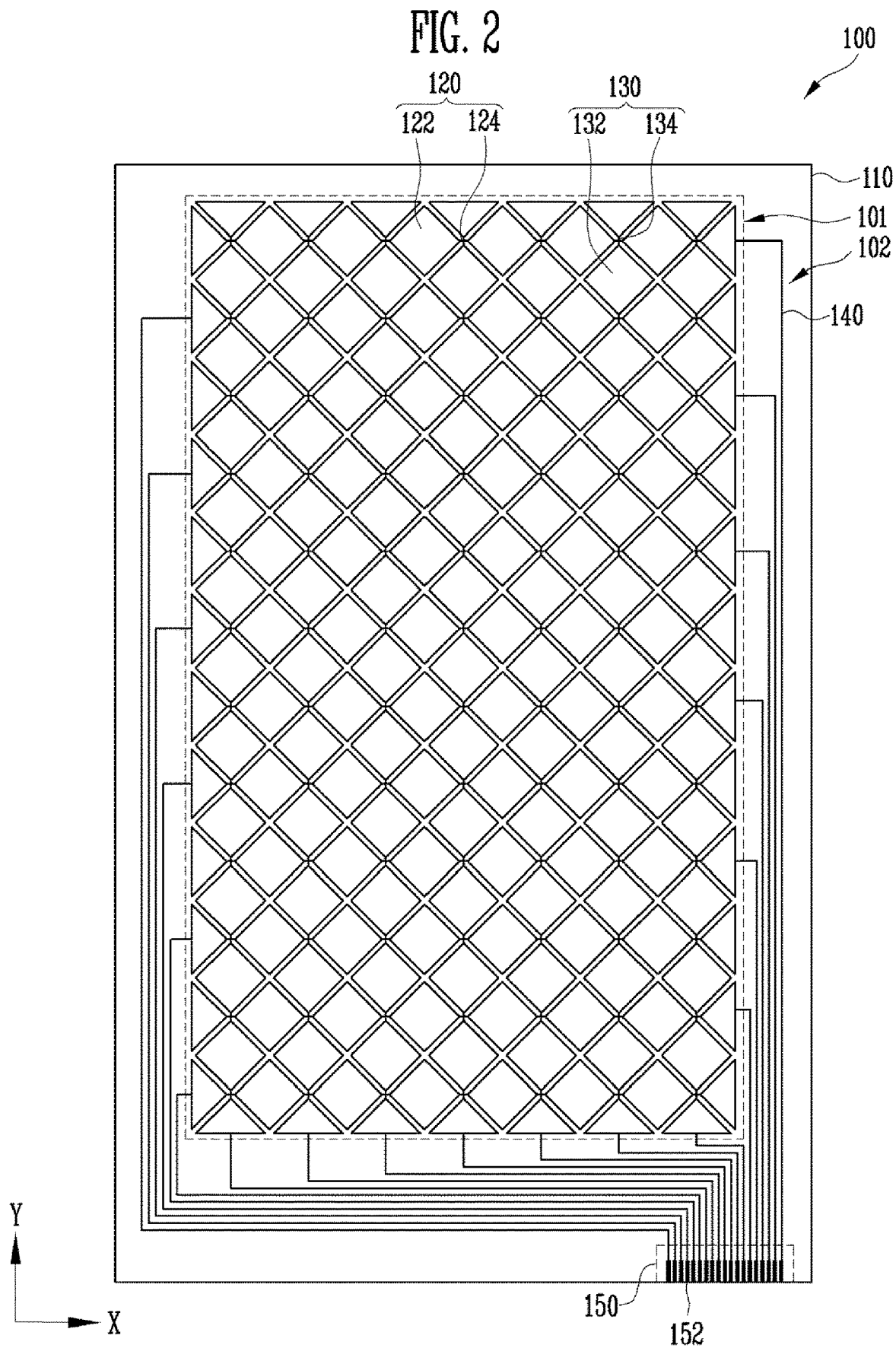
FIG. 2 illustrates a sensor unit of a touch sensor in accordance with an embodiment.

FIG. 1 is a schematic diagram illustrating a display device in accordance with an embodiment. FIG. 2 illustrates a sensor unit 100 of a touch sensor in accordance with an embodiment.

Referring to FIG. 1, the display device may include the sensor unit 100, a display panel 200, a touch driver 300, and a display driver 400. The sensor unit 100 and the touch driver 300 form the touch sensor.

In the embodiment of FIG. 1, although the sensor unit 100 and the display panel 200 are illustrated as being separated from each other, the present disclosure is not limited to this. For example, the sensor unit 100 and the display panel 200 may be integrally manufactured into a single body.

In an embodiment, the sensor unit 100 may be provided on at least one surface of the display panel 200. For instance, the sensor unit 100 may be provided on one surface (e.g., an upper surface) of opposite surfaces of the display panel 200 which corresponds to a direction in which an image is outputted. In an embodiment, the sensor unit 100 may be directly formed on at least one of the opposite surfaces of the display panel 200, or may be formed in the display panel 200. For example, the sensor unit 100 may be directly formed on an outer surface of an upper substrate or a lower substrate of the display panel 200 (e.g., on an upper surface of the upper substrate or a lower surface of the lower substrate), or may be directly formed on an inner surface of the upper substrate or the lower substrate (e.g., on a lower surface of the upper substrate or an upper surface of the lower substrate).

The sensor unit 100 may include a touch active area 101 capable of sensing a touch input, and a touch inactive area 102 which is disposed around the touch active area 101. In an embodiment, the touch active area 101 may be disposed to correspond to a display area 201 of the display panel 200.

In an embodiment, the sensor unit 100 may be disposed such that at least a certain region thereof overlaps the display panel 200. For example, at least a certain region, e.g., the touch active area 101, of the sensor unit 100 may be disposed on a certain region, e.g., the display area 201, of the display panel 200. In an embodiment, at least one electrode, e.g., first and second electrodes (or first-type and second-type electrode sets) 120 and 130, for detecting a touch input may be disposed in the touch active area 101. In other words, the first and second electrodes 120 and 130 may be provided on the display area 201 of the display panel 200.

Lines for connecting the electrodes, e.g., the first and second electrodes 120 and 130, provided in the touch active area 101 to the touch driver 300 and the like may be disposed in the touch inactive area 102. In an embodiment, the touch inactive area 102 may be disposed to correspond to a non-display area 202 of the display panel 200.

In an embodiment, the sensor unit 100 may include at least one first electrode 120 (or first electrode set 120) and at least one second electrode 130 (or second electrode set 130) which are provided in the touch active area 101. For example, the sensor unit 100 may include a plurality of first electrodes 120, and a plurality of second electrodes 130 which intersect the first electrodes 120. In an embodiment, the first electrodes 120 may extend in a first direction. The second electrodes 130 may be insulated from the first electrodes 120 by an insulating layer (not shown) or a space and may extend in a second direction intersecting the first direction. Capacitances Cse may be formed between the first electrodes 120 and the second electrodes 130, in particular, in respective intersections between the electrodes. Each capacitance Cse may be changed when a touch input is generated at a corresponding point or around the point. Therefore, the touch input may be sensed by detecting changes in the capacitances Cse.

The shapes, the sizes, and/or orientations of the first and second electrodes 120 and 130 are not limited to particular examples. In a non-limited embodiment pertaining to this, the first electrodes 120 and the second electrodes 130 may be provided in the form shown in FIG. 2.

Referring to FIG. 2, the sensor unit 100 may include a base substrate 110 on which a touch active area 101 and a touch inactive area 102 are defined, first electrodes 120 and second electrodes 130 which are provided in the touch active area 101 on the base substrate 110, and lines 140 and a pad unit 150 which are provided in the touch inactive area 102 on the base substrate 110.

The base substrate 110 may be a substrate which functions as a base for the sensor unit 100 and be formed of a rigid substrate or a flexible substrate. For example, the base substrate 110 may be a rigid substrate made of glass or reinforced glass, or a flexible substrate formed of a thin film made of flexible plastic. In an embodiment, the base substrate 110 may be unnecessary. For instance, in the case where the first and second electrodes 120 and 130 are directly formed on at least one substrate forming the display panel 200, the base substrate 110 provided to form the sensor unit 100 may be replaced with at least one substrate forming the display panel 200, an encapsulation layer, or the like.

The first electrodes 120 may extend in a first direction, e.g., in an X-axis direction. In an embodiment, each of the first electrodes 120 (or each first-type electrode set 120) disposed in each row may include a plurality of first sensing cells 122 (or first-type electrodes 122), and may include first coupling units (first-type connectors) 124 which electrically couple the first sensing cells 122 of a same row with each other in the first direction. In an embodiment, the first coupling units 124 may be integrally formed with the first sensing cells 122 or formed in a bridge type coupling pattern. Each first electrode 120 may be a driving electrode (Tx electrode) configured to receive a driving signal for touch drive, and/or a sensing electrode (Rx electrode) configured to output a sensing signal corresponding to the driving signal inputted to the driving electrode. For example, when the sensor unit 100 is a mutual capacitive touch sensor, the first electrodes 120 may be embodied as sensing electrodes for outputting sensing signals corresponding to a touch input.

The second electrodes 130 may extend in a second direction, e.g., in a Y-axis direction. In an embodiment, each of the second electrodes 130 (or each second-type electrode set 130) disposed in each column may include a plurality of second sensing cells 132 (or second-type electrodes 132), and may include second coupling units (second-type connectors) 134 which electrically couple the second sensing cells 132 of a same column with each other in the second direction. In an embodiment, the second coupling units 134 may be integrally formed with the second sensing cells 132 or formed in a bridge type coupling pattern. Each second electrode 130 may be a driving electrode configured to receive a driving signal for touch drive, and/or a sensing electrode configured to output a sensing signal corresponding to the driving signal inputted to the driving electrode. For example, when the sensor unit 100 is a mutual capacitive touch sensor, the first electrodes 120 may be sensing electrodes, and the second electrodes 130 may be driving electrodes.

The lines 140 may couple the respective first electrodes 120 and the respective second electrodes 130 with the pad unit 150. For example, each line 140 may electrically couple the corresponding first or second electrode 120 or 130 to a predetermined pad 152 provided in the pad unit 150.

The pad unit 150 may include a plurality of pads 152 which couple the first and second electrodes 120 and 130 with an external driving circuit, e.g., the touch driver 300. Signal transmission and/or power supply between the sensor unit 100 and the touch driver 300 may be embodied through the pad unit 150.

Referring again to FIG. 1, the display panel 200 may include the display area 201, and the non-display area 202 provided around the display area 201. In the display area 201, there may be provided a plurality of scan lines 210, a plurality of data lines 220, and a plurality of pixels P coupled to the scan lines 210 and the data lines 220. In the non-display area 202, there may be provided lines configured to supply various driving signals and/or power for driving the pixels P.

In the embodiments, the kind of display panel 200 is not limited to a particular kind of display panel. For example, the display panel 200 may be a spontaneous emission display panel such as an organic light emitting display (OLED) panel. In embodiments, the display panel 200 may be a non-emissive display panel such as a liquid crystal display (LCD) panel, an electrophoretic display (EPD) panel, or an electrowetting display (EWD) panel. In the case where the display panel 200 is a non-emissive display panel, the display device may further include a back-light unit for supplying light to the display panel 200.

The touch driver 300 may be electrically coupled with the sensor unit 100 and transmit/receive signals needed to drive the sensor unit 100. For example, the touch driver 300 may detect a touch input by supplying a driving signal to the sensor unit 100 and then receiving a sensing signal corresponding to the driving signal from the sensor unit 100. For this operation, the touch driver 300 may include a driving circuit and a sensing circuit. In an embodiment, the driving circuit and the sensing circuit may be integrated in a single touch integrated circuit (T-IC), but it is not limited thereto. In an embodiment, the driving circuit may successively supply driving signals to driving electrodes, e.g., the second electrodes 130, of the sensor unit 100. The sensing circuit may detect a touch input by receiving sensing signals from sensing electrodes, e.g., the first electrodes 120, of the sensor unit 100 and then processing the sensing signals.

The display driver 400 may be electrically coupled with the display panel 200 to supply a signal needed to drive the display panel 200. For example, the display driver 400 may include at least one of a scan driver configured to supply a scan signal to the scan lines 210, a data driver configured to supply a data signal to the data lines 220, and a timing controller configured to supply image data and/or various control signals for driving the scan driver and the data driver. In an embodiment, the scan driver, the data driver, and/or the timing controller may be integrated in a single display integrated circuit (D-IC). In an embodiment, at least one of the scan driver, the data driver, and the timing controller may be integrated or mounted on the display panel 200.

Figure 3:
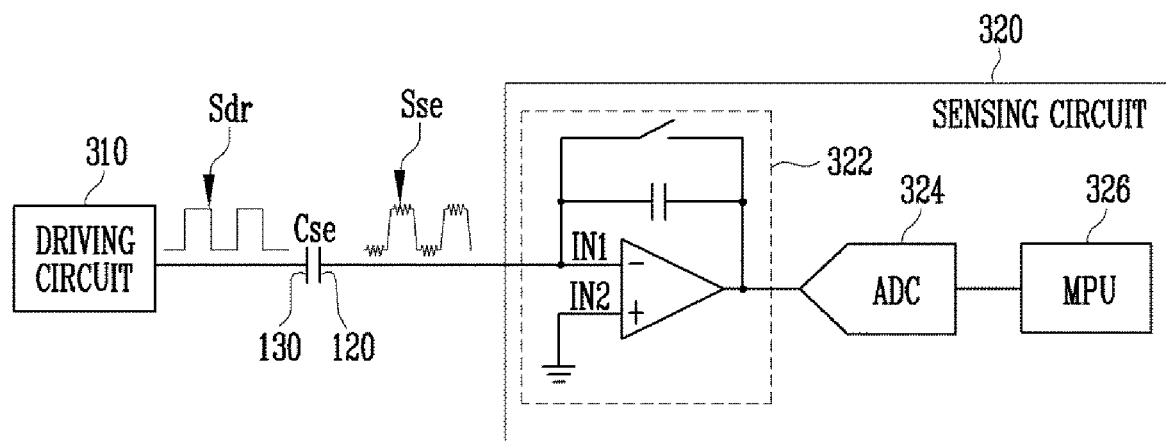
FIG. 3 is a diagram illustrating a method of driving the touch sensor in accordance with an embodiment.

FIG. 3 is a diagram illustrating a method of driving the touch sensor in accordance with an embodiment. For the sake of description, FIG. 3 illustrates a capacitance formed in an intersection between each first electrode 120 (or first-type connector 124) and a corresponding single second electrode 130 (or second-type connector 134). A method of detecting a touch input using the capacitance will be described with reference to FIG. 3.

Referring to FIG. 3, a capacitance Cse may be formed in an intersection between the first electrode 120 (or first connector 124) and the second electrode 130 (or second connector 134). The second electrode 130 may receive a driving signal Sdr from a driving circuit 310 provided in/from the touch driver 300. Then, a sensing signal Sse corresponding to the driving signal Sdr may be outputted from the second electrode 120 by a coupling operation of the capacitance Cse. The sensing signal Sse may be inputted to a sensing circuit 320 provided in the touch driver 300. The sensing circuit 320 may amplify, convert, and process a sensing signal Sse inputted from each second electrode 120 and, as a result, detect a touch input.

In an embodiment, the sensing circuit 320 may include a signal receiver 322, an analog digital converter (hereinafter, referred to simply as 'ADC') 324, and a signal processor 326.

The signal receiver 322 may receive a sensing signal Sse from each first electrode 120. The signal receiver 322 may amplify the sensing signal Sse and output it. For example, the signal receiver 322 may be embodied by an analog front end (hereinafter, referred to as an 'AFE') including at least an operational amplifier (hereinafter, referred to as an 'op-amp'). In an embodiment, a first input terminal IN1 of the signal receiver 322, e.g., an inverting input terminal of the op-amp, may be electrically coupled to each first electrode 120. In other words, a sensing signal Sse may be inputted from the first electrode 120 to the first input terminal IN1. A second input terminal IN2 of the signal receiver 322, e.g., a non-inverting input terminal of the op-amp, may be electrically coupled to a ground (hereinafter, referred to simply as 'GND') terminal. In other words, a GND voltage may be inputted to the second input terminal IN2.

The ADC 324 may convert an analog signal inputted from the signal receiver 322, to a digital signal. In an embodiment, the number of ADCs 324 may correspond to the number of sensing electrodes 120 such that each ADC 324 corresponds, in a one-to-one manner, to a sensing channel corresponding to the associated first electrode 120. In an embodiment, the ADC 324 may be configured such that a plurality of sensing electrodes 120 shares the single ADC 324. In an embodiment, an additional switching circuit may be provided between the signal receiver 322 and the ADC 324.

The signal processor 326 may process a converted signal (digital signal) received from the ADC 324 and detect a touch input depending on a result of the process of the signal. For example, the signal processor 326 may comprehensively analyze signals (amplified and converted sensing signals Sse) inputted from the plurality of first electrodes 120 via the signal receiver 322 and the ADC 324, and detect whether a touch input has been generated and a location of the touch input. In an embodiment, the signal processor 326 may be embodied by a microprocessor (hereinafter, referred to simply as 'MPU'). In an embodiment, an additional memory needed to drive the signal processor 326 may be provided in the sensing circuit 320. The configuration of the signal processor 326 may not be limited to this. In an embodiment, the signal processor 326 may be embodied by a microcontroller (MCU) or the like.

The touch sensor having the above-mentioned configuration may be coupled with the display panel 200 or the like.

For example, the sensor unit 100 may be manufactured integrally with the display panel 200, or manufactured separately from the display panel 200 and then attached to at least one surface of the display panel 200.

If the sensor unit 100 is coupled with the display panel 200, a parasitic capacitance may be generated between the sensor unit 100 and the display panel 200. Noise may be transmitted from the display panel 200 to the touch sensor, particularly, the sensor unit 100, by a coupling operation or the like of the parasitic capacitance. For example, noise caused by a driving signal for driving the display panel 200 may be applied to the sensor unit 100.

The noise applied to the touch sensor may cause a ripple in the sensing signal Sse, thus affecting the sensitivity of the touch sensor. Embodiments may improve sensitivity of a touch sensor.

Figure 4:
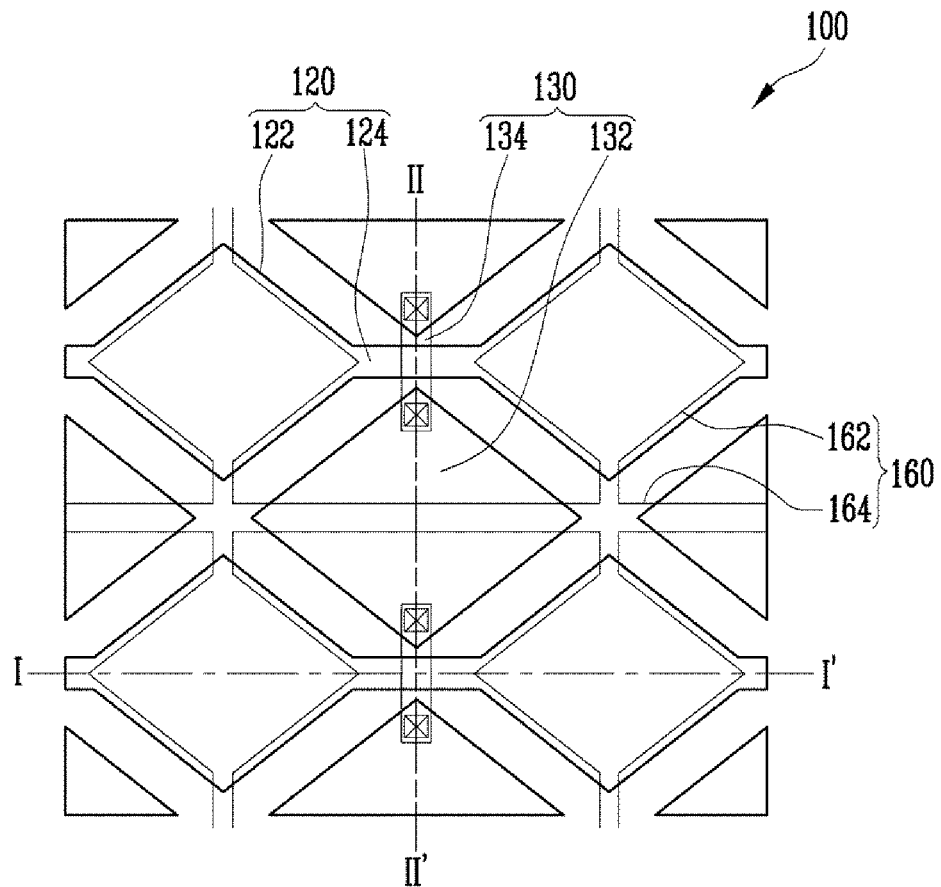
FIG. 4 illustrates a sensor unit of a touch sensor in accordance with an embodiment.
Figure 5A:
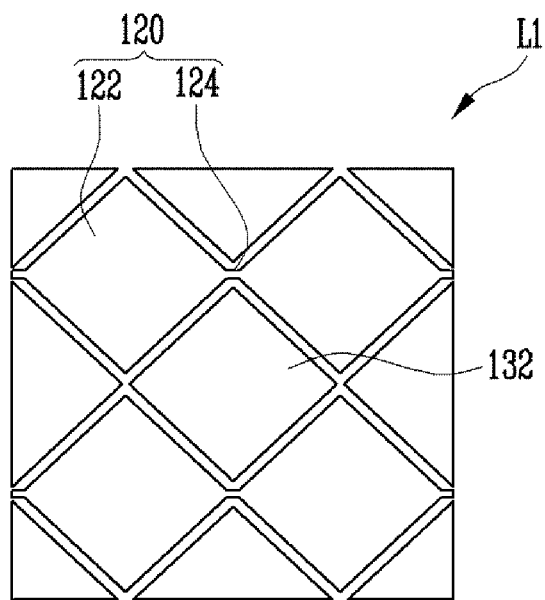
FIG. 5A illustrates a first layer of the sensor unit in accordance with the embodiment of FIG. 4.
Figure 5B:
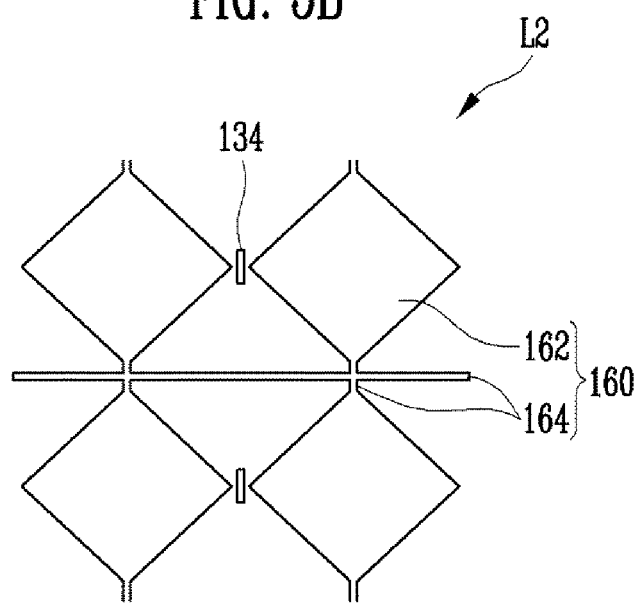
FIG. 5B illustrates a second layer of the sensor unit in accordance with the embodiment of FIG. 4.
Figure 6A:
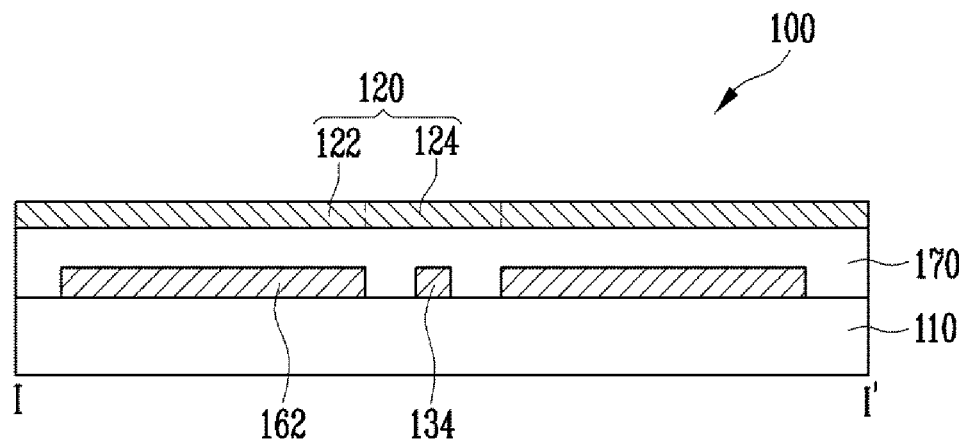
FIG. 6A illustrates an example embodiment of a sectional view taken along line I-I' of FIG. 4.
Figure 6B:
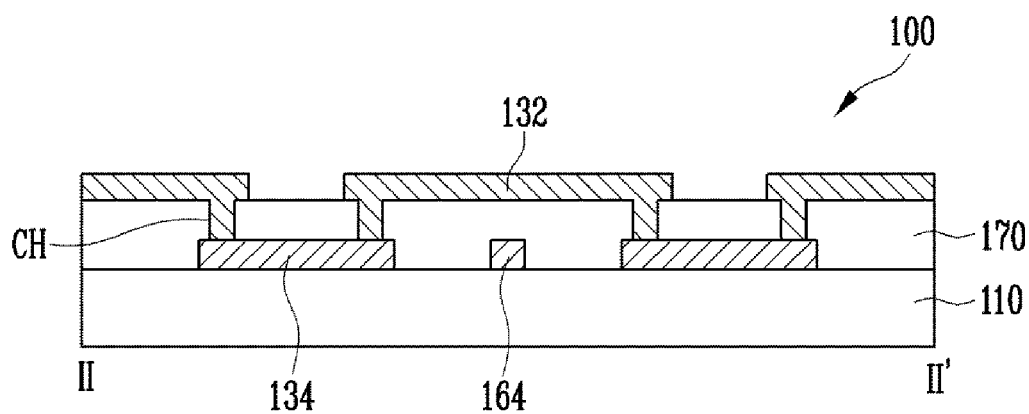
FIG. 6B illustrates an example embodiment of a sectional view taken along line II-II' of FIG. 4.

FIG. 4 illustrates a sensor unit of a touch sensor in accordance with an embodiment, and FIGS. 5A and 5B respectively illustrate a first layer and a second layer of the sensor unit in accordance with an embodiment. FIGS. 6A and 6B respectively illustrate examples of sectional views taken along lines I-I' and II-II' of FIG. 4. FIGS. 4 to 6B illustrate a certain region of the touch sensor, e.g., a certain region of the touch active area, in accordance with an embodiment. In an embodiment of FIGS. 4 to 6B, like reference numerals may be used to designate the same or similar elements as those of the embodiment of FIGS. 1 to 3, and detailed descriptions may not be repeated.

Referring to FIGS. 4 to 6B, the sensor unit 100 of the touch sensor in accordance with an embodiment may include first electrodes 120 and second electrodes 130 which respectively extend in first and second directions, and a conductive layer 160, at least a certain region of which overlaps the first electrodes 120. The first and second directions may be different directions intersecting with each other. For example, if the first direction is a horizontal direction, the second direction may be a vertical direction or a diagonal direction.

Each of the first electrodes 120 may include a plurality of first sensing cells 122 arranged in the first direction, and may include a plurality of first connectors 124 which electrically couple the first sensing cells 122 with each other in the first direction. In an embodiment, the first sensing cells 122 and the first connectors 124 may be integrally coupled with each other.

Each of the second electrodes 130 may include a plurality of second sensing cells 132 which are arranged in the second direction and spaced apart from the first sensing cells 122, and may include a plurality of second connectors 134 which electrically couple the second sensing cells 132 with each other in the second direction. In an embodiment, the second sensing cells 132 may be spaced apart from the first sensing cells 122 such that the second sensing cells 132 do not overlap the first sensing cells 122 in a third direction perpendicular to each of the first direction and the second direction. For example, the first sensing cells 122 and the second sensing cells 132 may be alternately arranged.

In an embodiment, the second sensing cells 132 and the second connectors 134 which constitute each second electrode 130 may be disposed in different layers of a plurality of layers forming the sensing unit 100 and electrically coupled with each other through contact connection or the like. For example, the second sensing cells 132, along with the first sensing cells 122 and the first connectors 124, may be disposed on/in the first layer L1, and the second connectors 134 may be disposed on/in the second layer L2 different from the first layer L1.

In an embodiment, the first layer L1 and the second layer L2 may be layers spaced apart from each other with at least one insulating layer 170 interposed between layers L1 and L2. For example, based on the base substrate 110, the first layer L1 may be an upper layer, and the second layer L2 may be a lower layer. In other words, the second layer L2, the insulating layer 170, and the first layer L1 may be successively disposed on one surface of the base substrate 110. In an embodiment, the first layer L1 may be a lower layer, and the second layer L2 may be an upper layer.

In an embodiment, the second layer L2 may be a layer closer to the display panel 200 than is the first layer L1. That is, the second layer L2 may be disposed between the display panel 200 and the first layer L1.

In the case where the insulating layer 170 is interposed between the first layer L1 and the second layer L2, the second connectors 134 may be electrically coupled with the second sensing cells 132 through contact holes CH formed in the insulating layer 170

The conductive layer 160 may be disposed in at least the touch active area 101. For instance, the conductive layer 160 may be uniformly disposed on the entirety of the touch active area 101. In an embodiment, an opening may be formed in the conductive layer 160. For example, when the second connectors 134 and the conductive layer 160 are disposed on the same layer, the opening may be formed in the conductive layer 160 to secure the insulating performance between the conductive layer 160 and the second connectors 134. That is, in an embodiment, the second connectors 134 may be disposed in the opening of the conductive layer 160.

The conductive layer 160 may be spaced apart from the first electrodes 120, and may overlap the first electrodes 120. For example, in an embodiment in which the display panel 200 is disposed on a lower surface of the base substrate 110 (which faces away from the surface on which the first and second electrodes 120 and 130 are provided), the conductive layer 160 may be disposed in an intermediate layer between the display panel 200 and the first layer L1 on which the first electrodes 120 are disposed. For example, the conductive layer 160 may be disposed, along with the second connectors 134, on the second layer L2 of the sensor unit 100, and spaced apart from the second connectors 134.

In an embodiment, the conductive layer 160 may include a plurality of electrode parts 162 (or conductive parts 162), and one or more connection lines 164 configured to electrically couple the electrode parts 162 with each other. For example, the connection line 164 may be integrally coupled with the electrode parts 162 so that all of the electrode parts 162 may be electrically coupled with each other over the entirety of the touch active area 101.

In an embodiment, each of the electrode parts 162 may overlap a corresponding first sensing cell 122. In FIG. 4, to clearly distinguish the first sensing cells 122 from the electrode parts 162, the area of each electrode part 162 is illustrated as being less than that of each first sensing cell 122. The size of each of the electrode parts 162 relative to its corresponding sensing cell 122 may be configured according to particular embodiments.

For example, each electrode part 162 may have a shape and an area corresponding to (e.g., similar to) those of the corresponding first sensing cell 122, and be disposed such that the electrode part 162 overlaps the first sensing cell 122. For example, each electrode part 162 may have substantially the same shape and area as those of the corresponding first sensing cell 122, and thus be disposed such that the electrode part 162 completely overlaps the first sensing cell 122. In an embodiment, the electrode parts 162 may be formed below the first sensing cells 122 and disposed to correspond to the corresponding first sensing cells 122. In an embodiment, each of the electrode parts 162 may have an area greater than that of the corresponding first sensing cell 122, and only a certain region of the electrode part 162 may overlap the first sensing cell 122. In an embodiment, the electrode parts 162 and the first sensing cells 122 may partially overlap each other regardless of the area of each electrode part 162.

In the embodiment of FIGS. 4 to 6B, the shape of each of the electrode parts 162 has illustrated as corresponding to that of the corresponding first sensing cell 122. The shape of each electrode part 162 may be configured according to particular embodiments.

In an embodiment, the conductive layer 160 may be insulated from the first and second electrodes 120 and 130. In an embodiment, a parasitic capacitance may be formed between the conductive layer 160 and first and/or second electrodes 120 and/or 130.

In an embodiment, the conductive layer 160 may be electrically coupled to at least one power input terminal included in the touch driver 300. For example, the conductive layer 160 may be electrically coupled to at least the second input terminal IN2 of the signal receiver 322. In an embodiment, the second input terminal IN2 may be a ground terminal of the signal receiver (e.g., the AFE) 322.

In an embodiment, the conductive layer 160 may be coupled to a ground terminal which is shared by circuit elements constituting the touch driver 300 (e.g., by circuit elements constituting the driving circuit 310 and the sensing circuit 320). In an embodiment, depending on a change in voltage of the conductive layer 160, the ground voltage of the touch driver 300 may be generally changed. In an embodiment, depending on the potential (voltage level) of the conductive layer 160, the reference potential of the touch driver 300 may be changed.

In an embodiment, the conductive layer 160 may be formed below the first electrodes 120, e.g., between the first electrodes 120 and the display panel 200. Depending on a change in voltage of the conductive layer 160, the reference potential of the touch driver 300 may change. The potential of the conductive layer 160 may change depending on noise applied from the display panel 200 or the like to the sensor unit 100.

In an embodiment, as well as the electrodes (e.g., the first and second electrodes 120 and 130) for detecting a touch input, the additional conductive layer 160 may be formed as a noise detection electrode (or a noise detection pattern). The overall reference potential of the touch driver 300 may be changed using an output signal from the conductive layer 160.

As such, if the reference potential of the touch driver 300, in particular, the reference potential of the signal receiver 322 provided in the input terminal of the sensing circuit 320, changes depending on the potential of the conductive layer 160, common mode noise which is applied from the display panel 200 to the sensor unit 100 may be offset (or cancelled). Consequently, a signal-to-noise ratio (SNR) of the touch sensor may be enhanced, whereby the sensitivity of the touch sensor may be enhanced. That is, embodiments may provide a touch sensor and/or a touch display device having high touch sensitivity.

The embodiment may be effectively used in a display device in which the distance between the sensor unit 100 and the display panel 200 is relatively short. For instance, the embodiment may be useful for enhancing the touch sensitivity in an on-cell type display device which is sensitive to noise because the first and second electrodes 120 and 130 are directly formed on the upper substrate or the thin-film encapsulation layer of the display panel 200. Embodiments may be applied to various display devices or electronic devices.

Figure 7:
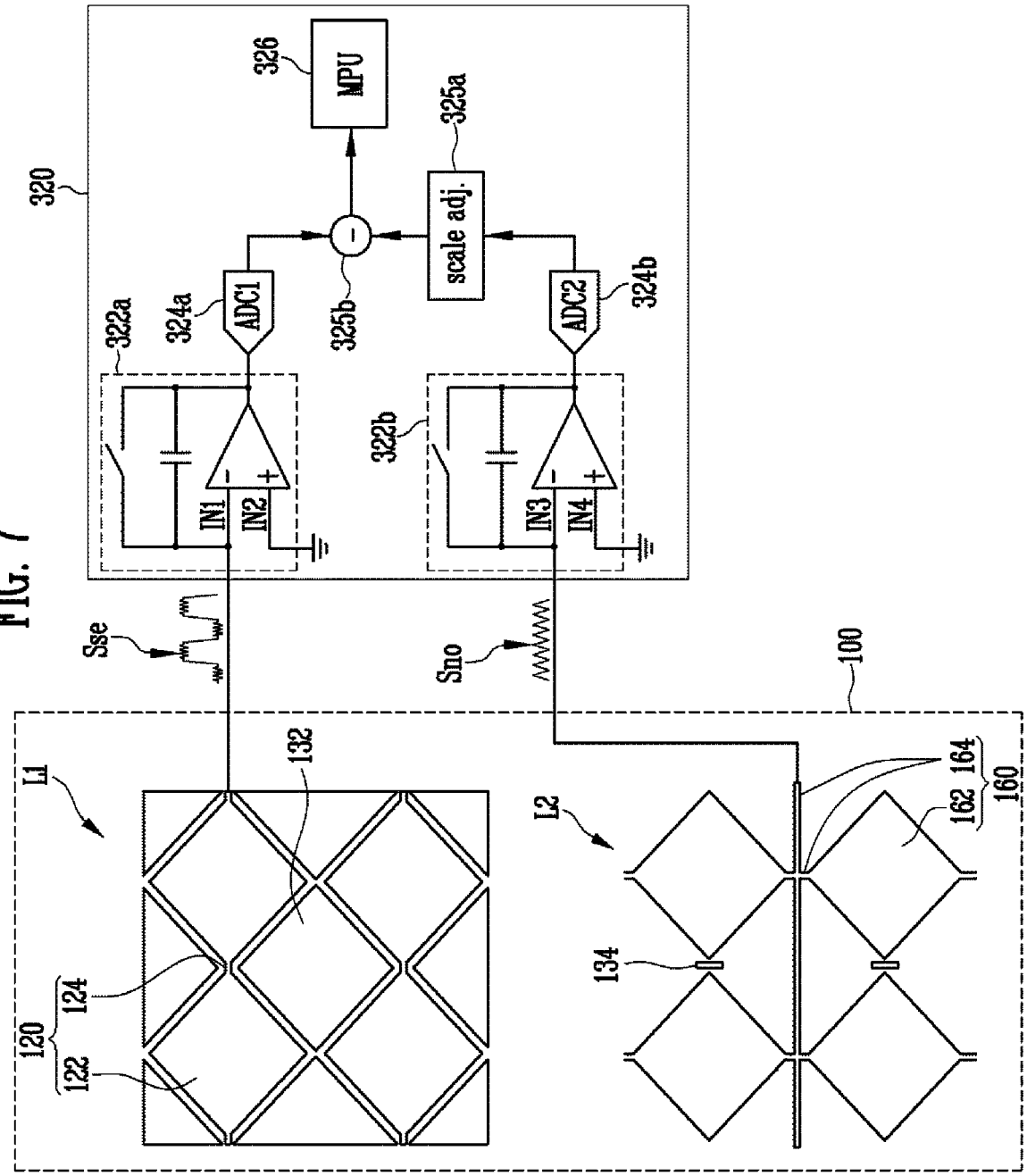
FIG. 7 illustrates a touch sensor in accordance with an embodiment.

FIG. 7 illustrates a touch sensor in accordance with an embodiment. In an embodiment of FIG. 7, like reference numerals may be used to designate the same or similar elements as those of the embodiments of FIGS. 1 to 6B, and detailed descriptions may not be repeated.

Referring to FIG. 7, the touch sensor in accordance with an embodiment may include a sensor unit 100, and a sensing circuit 320 electrically coupled to the sensor unit 100. Although the illustration in FIG. 7 is focused on only the sensor unit 100 and the sensing circuit 320, the touch sensor according to the embodiment of FIG. 7 may also further include the above-described driving circuit 310, etc. In an embodiment, the touch sensor in according with this embodiment may include a touch driver 300 which includes a driving circuit 310 electrically coupled to the sensor unit 100 and configured to supply a driving signal Sdr to second electrodes 130, and a sensing circuit 320 configured to receive sensing signals Sse from the first electrodes 120.

In an embodiment, the sensing circuit 320 may include first and second signal receivers 322a and 322b, first and second ADCs 324a and 324b, a scale adjuster 325a, a subtractor 325b, and a signal processor 326. The sensing circuit 320 may receive sensing signals Sse from the first electrodes 120 and detect a touch input in response to the sensing signal Sse.

The first signal receiver 322a and the first ADC 324a may correspond to the signal receiver 322 and the ADC 324 that are included in the embodiment of FIG. 3. In an embodiment, the first signal receiver 322a and the first ADC 324a may receive and amplify a sensing signal Sse from each first electrode 120, convert it to a digital signal, and then output it.

The second signal receiver 322b may receive a noise signal Sno from the conductive layer 160 and amplify it. In an embodiment, a first input terminal IN3 of the second signal receiver 322b, e.g., an inverting input terminal of an op-amp, may be electrically coupled to the conductive layer 160. A second input terminal IN4 of the second signal receiver 322b, e.g., a non-inverting input terminal of the op-amp, may be electrically coupled to the GND terminal.

The second ADC 324b may convert an output signal of the second signal receiver 322b to a digital signal. In an embodiment, the second signal receiver 322b and the second ADC 324b may receive and amplify a noise signal Sno transmitted from the conductive layer 160, convert it to a digital signal, and then output the digital signal.

The scale adjuster 325a may adjust the size of the noise signal Sno so that the noise can be offset in a following subtraction operation. The subtractor 325b may subtract an output signal of the first ADC 324a by an output signal of the second ADC 324b that has been adjusted by the scale adjuster 325a. Therefore, common mode noise applied to the first sensing electrode 120 and the conductive layer 160 of the sensor unit 100 may be offset.

In an embodiment, the conductive layer 160 along with the first sensing electrode 120 may receive a noise. The noise applied to the conductive layer 160 may be amplified and/or converted to a digital signal, and adjusted in size before being used in a subtraction operation along with a sensing signal Sse converted to a digital signal. In accordance with an embodiment, common mode noise applied to the sensor unit 100 may be offset (removed or cancelled) by subtraction, whereby the sensitivity of the touch sensor may be enhanced.

Figure 8:
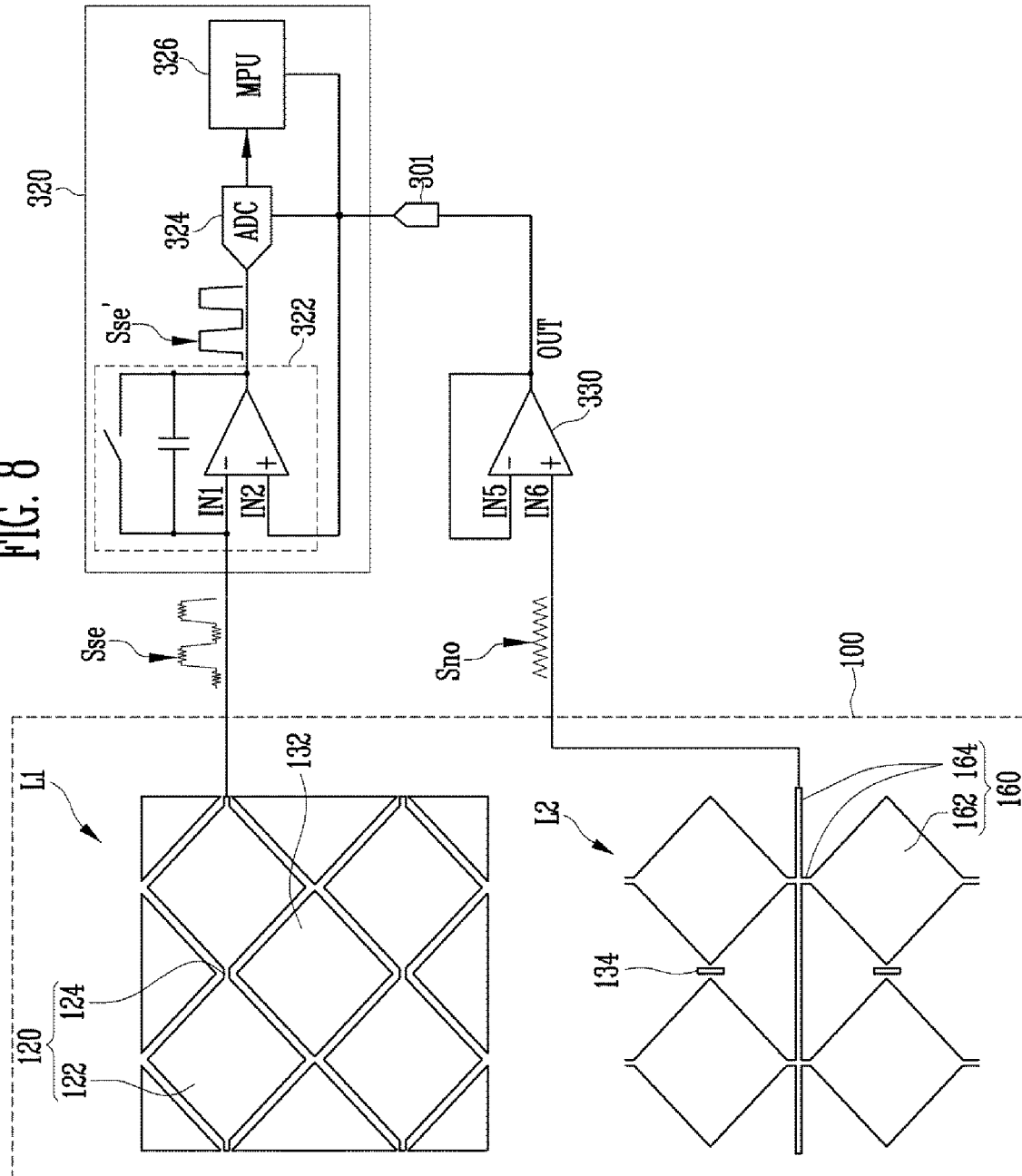
FIG. 8 illustrates a touch sensor in accordance with an embodiment.

FIG. 8 illustrates a touch sensor in accordance with an embodiment. In an embodiment of FIG. 8, like reference numerals may be used to designate the same or similar elements as those of the embodiments of FIGS. 1 to 7, and detailed descriptions may not be repeated.

Referring to FIG. 8, the sensing circuit 320 may include a signal receiver 322, an ADC 324, and a signal processor 326.

The signal receiver 322 may receive a sensing signal Sse from each first electrode 120, amplify the received sensing signal Sse, and output it. For example, the signal receiver 322 may be embodied by an AFE including an op-amp, as shown in the embodiment of FIG. 3.

In an embodiment, a first input terminal IN1 of the signal receiver 322, e.g., an inverting input terminal of the op-amp, may be electrically coupled to each first electrode 120 and thus receive a sensing signal Sse from the first electrode 120. Here, the sensing signal Sse may include common mode noise applied to the sensor unit 100. In an embodiment, the sensing signal Sse to be inputted to the signal receiver 322 may have ripple corresponding to the noise.

In an embodiment, a second input terminal IN2 of the signal receiver 322, e.g., a non-inverting input terminal of the op-amp, may be electrically coupled to the GND terminal 301. The GND terminal 301 may be electrically coupled to the conductive layer 160 and thus receive a noise signal Sno from the conductive layer 160. In an embodiment, the second input terminal IN2 of the signal receiver 322 may be electrically coupled with the conductive layer 160 and thus use, as the reference potential, the potential of the noise signal Sno transmitted from the conductive layer 160.

In an embodiment, the GND terminal 301 may be a terminal which is shared by circuit elements, e.g., the signal receiver 322, the ADC 324, and the signal processor 326, constituting the sensing circuit 320. The driving circuit 310 and the sensing circuit 320 described above may share the same GND terminal 301. That is, in an embodiment, various circuit elements provided in the touch driver 300 are coupled in common to the GND terminal 301 of the touch driver 300 so that they may operate with the potential of the GND terminal 301 as the reference potential.

In an embodiment, a buffer 330 may be provided between the second input terminal IN2 of the signal receiver 322 and the conductive layer 160. The buffer 330 may be electrically coupled between the GND terminal 301 and the conductive layer 160 so that a noise signal inputted from the conductive layer 160 may be buffered by the buffer 330 before being outputted. In an embodiment, a first input terminal IN5, e.g., an inverting input terminal, of the buffer 330 may be electrically coupled to an output terminal OUT. A second input terminal IN6, e.g., a non-inverting input terminal, of the buffer 330 may be electrically coupled to the conductive layer 160 and thus receive a noise signal Sno.

The ADC 324 may convert an analog signal inputted from the signal receiver 322, to a digital signal. The signal processor 326 may process a converted signal (digital signal) received from the ADC 324 and detect a touch input depending on a result of the process of the signal.

In an embodiment, the ADC 324 and the signal processor 326 may be electrically coupled to the GND terminal 301 of the touch driver 300. For example, reference voltage terminals of the ADC 324 and the signal processor 326 may be electrically coupled to the GND terminal 301 of the touch driver 300. The ADC 324 and the signal processor 326 may operate with the potential of the GND terminal 301 as the reference potential.

In the above-mentioned configuration, the signal receiver 322 may receive a sensing signal Sse and a noise signal Sno respectively through the first input terminal IN1 and the second input terminal IN2. Here, the sensing signal Sse and the noise signal Sno may include, in common, noise applied to the sensor unit 100. The signal receiver 322 may amplify the sensing signal Sse based on the potential of the noise signal Sno and output it. In an embodiment, the signal receiver 322 may output a signal corresponding to a difference in voltage between the first input terminal IN1 and the second input terminal IN2. Thereby, the noise may be offset in the signal receiver 322.

That is, in this embodiment, the reference voltage of the signal receiver 322 may change depending on a change in voltage of the noise signal Sno transmitted from the conductive layer 160. For example, it is possible to make the reference voltage of the signal receiver 322 equal to the noise signal Sno. Therefore, ripple attributable to noise may be reduced or removed in an output signal Sse' outputted from the signal receiver 322.

Furthermore, in an embodiment, the reference voltage of the ADC 324 and the signal processor 326 may also change depending on the voltage of the noise signal Sno. Hence, the common GND terminal 301 of the touch driver 300 may be electrically coupled with the conductive layer 160 even without a change in the internal circuit or wiring structure of the touch driver 300, whereby common mode noise can be easily offset.

In according to an embodiment, an analog circuit terminal of the touch driver 300, e.g., the signal receiver 322 of the sensing circuit 320, may use the noise signal Sno as the reference voltage, so that common mode noise applied from the display panel 200 or the like to the sensor unit 100 may be offset or reduced. Consequently, the sensitivity of the touch sensor may be enhanced.

Figure 9:
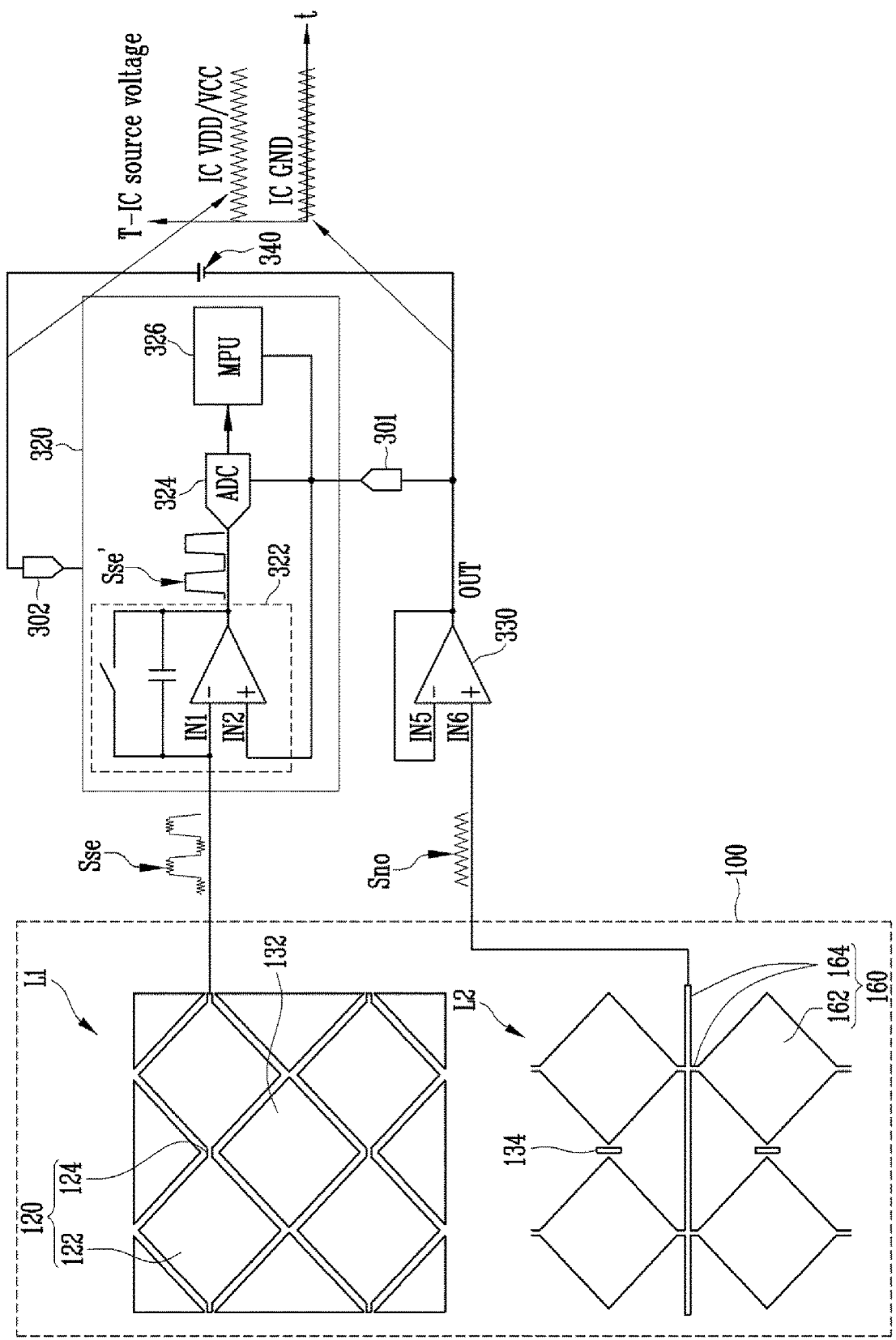
FIG. 9 illustrates a touch sensor in accordance with an embodiment.

FIG. 9 illustrates a touch sensor in accordance with an embodiment. In an embodiment of FIG. 9, like reference numerals may be used to designate the same or similar elements as those of the embodiments of FIGS. 1 to 8, and detailed descriptions may not be repeated.

Referring to FIG. 9, the touch sensor in accordance with an embodiment may include a power supply 340 including a power source such as a battery. In an embodiment, the power supply 340 may supply a first voltage and a second voltage respectively to a first power terminal 302 and a second power terminal 301 of the touch driver 300. In an embodiment, the first voltage may be a high-potential supply voltage (e.g., a VCC/VDD voltage), and the second voltage may be a low-potential supply voltage (e.g., a GND voltage).

In an embodiment, the second power terminal 301 may be a GND terminal of the touch driver 300. For example, the second power terminal 301 may be electrically coupled to a second input terminal IN2 of the signal receiver 322 and the reference voltage terminals of the ADC 324 and the signal processor 326. In an embodiment, the touch driver 300 including the sensing circuit 320 may operate using the potential of the second power terminal 301 as the reference potential.

In an embodiment, the second power terminal 301 may be electrically coupled with the conductive layer 160. For example, the second power terminal 301 may be electrically coupled to the output terminal OUT of the buffer 330. Thus, a noise signal Sno is inputted to the second power terminal 301.

In the above-mentioned configuration, the voltages, i.e., the first voltage and the second voltage, of the first power terminal 302 and the second power terminal 301 of the touch driver 300 may change together depending on a change (or variations) in voltage of the noise signal Sno transmitted from the conductive layer 160. Therefore, a difference between the first voltage and the second voltage may be maintained substantially constant.

That is, in an embodiment, the first and second electrodes 120 and 130 of the sensor unit 100, and various circuit elements (e.g., the signal receiver 322, the ADC 324, the signal processor 326, etc.) provided in the touch driver 300 may change in voltage level together depending on a change in voltage of the noise signal Sno. Therefore, due to the effect of offsetting noise generated in the touch sensor, the sensor unit 100 and the touch driver 300 may reliably operate without a malfunction due to noise.

Figure 10:
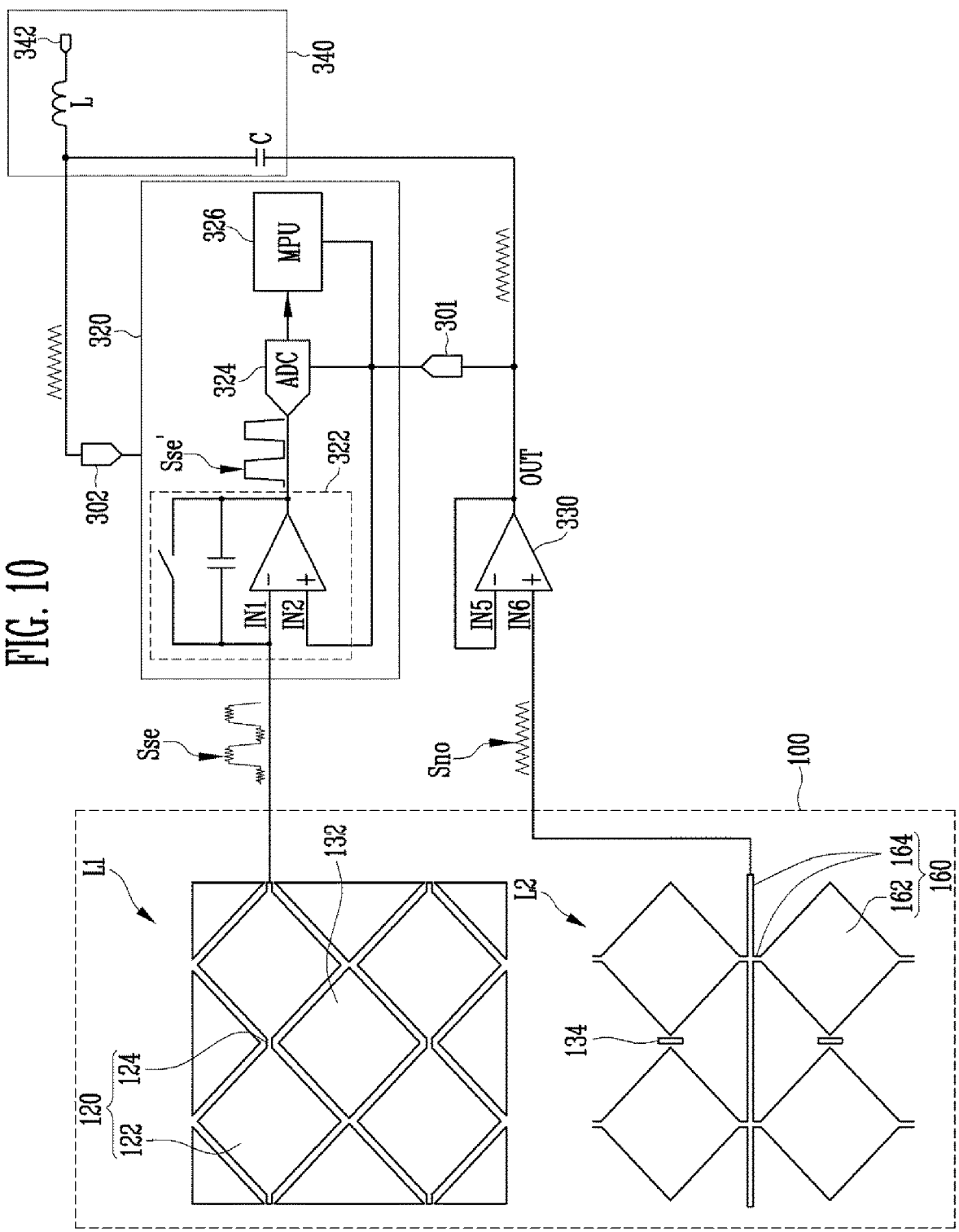
FIG. 10 illustrates a touch sensor in accordance with an embodiment.

FIG. 10 illustrates a touch sensor in accordance with an embodiment. In an embodiment of FIG. 10, like reference numerals may be used to designate the same or similar elements as those of the embodiments of FIGS. 1 to 9, and detailed descriptions may not be repeated.

Referring to FIG. 10, the touch sensor in accordance with an embodiment may include a power supply 340 configured to supply a first voltage and a second voltage respectively to a first power terminal 302 and a second power terminal 301 of the touch driver 300. In an embodiment, the power supply 340 may include a power input terminal 342, an inductor L, and a capacitor C. The inductor L and the capacitor C may form a low pass filter (hereinafter, referred to simply as 'LPF').

The power input terminal 342 may receive a predetermined level of power voltage from an external driving circuit such as a host system.

The inductor L may be electrically coupled between the power input terminal 342 and the first power terminal 302. The inductor L may separate the power input terminal 342 from the first power terminal 302 in an alternating current (AC) manner. Therefore, a ripple voltage of the first power terminal 302 corresponding to a noise signal Sno may be prevented from being transmitted to the power input terminal 342.

The capacitor C may be electrically coupled between the first power terminal 302 and the second power terminal 301. The capacitor C may function as a bypass capacitor configured to maintain a constant voltage difference between opposing terminals.

In an embodiment, while a high-frequency noise signal Sno is bypassed by the capacitor C, the voltage of the first power terminal 302 along with the voltage of the second power terminal 301 may also change depending on the noise signal Sno. Therefore, common mode noise applied to the sensor unit 100 may be offset in the touch sensor. Consequently, the sensitivity of the touch sensor may be enhanced, and the operational reliability thereof may also be improved.

The inductance of the inductor L and the capacitance of the capacitor C may be configured depending on the (estimated) frequency of noise. For example, depending on the frequency of a noise signal Sno transmitted from the display panel 200 or the like, a cutoff frequency of the LPF is set. In response to this, characteristic values of the inductor L and the capacitor C may be set.

Figure 11:
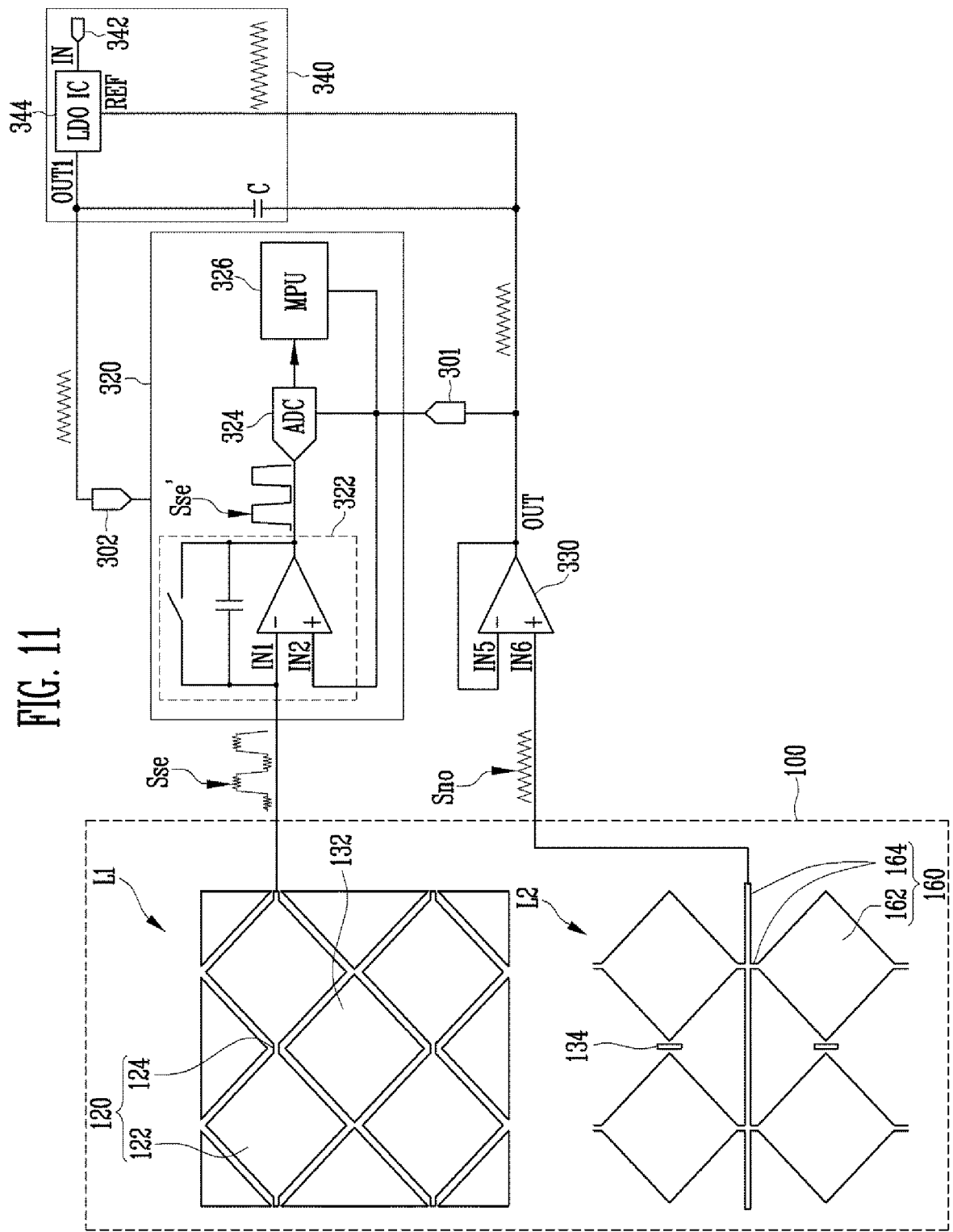
FIG. 11 illustrates a touch sensor in accordance with an embodiment.

FIG. 11 illustrates a touch sensor in accordance with an embodiment. In an embodiment of FIG. 11, like reference numerals may be used to designate the same or similar elements as those of the embodiments of FIGS. 1 to 10, and detailed descriptions may not be repeated.

Referring to FIG. 11, the touch sensor in accordance with an embodiment may include a power supply 340 configured to supply a first voltage and a second voltage respectively to a first power terminal 302 and a second power terminal 301 of the touch driver 300. In an embodiment, the power supply 340 may include a power input terminal 342, a low dropout regulator IC (hereinafter, referred to simply as 'LDO IC'), and a capacitor C.

The power input terminal 342 may receive a predetermined level of power voltage from an external driving circuit such as a host system.

The LDO IC 344 may be electrically coupled between the power input terminal 342 and the first power terminal 302. In an embodiment, an input terminal IN of the LDO IC 344 may be electrically coupled to the power input terminal 342, and an output terminal OUT1 thereof may be electrically coupled to the first power terminal 302. A reference voltage terminal REF of the LDO IC 344 may be electrically coupled to the second power terminal 301.

In response to a supply voltage inputted from the power input terminal 342, the LDO IC 344 may output a first voltage having a potential higher by a predetermined voltage than the potential of the reference voltage terminal REF. In an embodiment, a difference in voltage between the reference voltage terminal REF and the output terminal OUT1 of the LDO IC 344 may be maintained substantially constant.

The capacitor C may be electrically coupled between the first power terminal 302 and the second power terminal 301. The capacitor C may function as a bypass capacitor configured to maintain voltages on opposing terminals constant.

In the above-mentioned configuration, the LDO IC 344 may be provided in the power supply 340 of the touch sensor, and a noise signal Sno may be applied to the reference voltage terminal REF of the LDO IC 344. Therefore, the first voltage to be applied to the first power terminal 302 through the output terminal OUT1 of the LDO IC 344 may change, along with the second voltage to be applied to the second power terminal 301, depending on a change in voltage of the noise signal Sno. In an embodiment, the first voltage and the second voltage may have ripples corresponding to each other. Consequently, sufficient noise offset effect may be attained in the touch sensor, the sensitivity of the touch sensor may be enhanced, and the operational reliability of the touch sensor may be improved.

According to an embodiment, common mode noise transmitted from a display panel 200 or the like to a sensor unit 100 may be offset or cancelled. Consequently, embodiments may provide a touch sensor and/or a touch display device having satisfactory touch sensitivity.

While example embodiments have been described, the described embodiments are illustrative and should not be considered limiting. It should be understood by those skilled in the art that various changes, substitutions, and alternations may be made to the embodiments without departing from the scope defined by the following claims.

What is claimed is:

1. A display device comprising:
   a display panel;
   a sensor unit provided on the display panel and configured to output a sensing signal corresponding to a touch input, the sensor unit comprising a first electrode and comprising a conductive layer provided between the display panel and the first electrode, overlapping the first electrode, and spaced from the first electrode; and
   a touch driver comprising a signal receiver,
   wherein the signal receiver comprises a first input terminal electrically coupled to the first electrode, comprises a second input terminal electrically coupled to the conductive layer, is configured to receive the sensing signal, and is configured to output an analog signal corresponding to a voltage difference between the first input terminal and the second input terminal, and
   wherein the conductive layer comprises a plurality of conductive parts overlapping the first electrode, arranged in at least two rows and at least two columns, and having a shape corresponding to the first electrode, and a connection line integrally connected to the conductive parts to electrically connect all of the conductive parts to each other.

2. The display device according to claim 1, wherein the second input terminal is a ground terminal.

3. The display device according to claim 1, wherein the touch driver comprises a ground terminal electrically coupled to the second input terminal.

4. The display device according to claim 3, further comprising: an analog-digital converter, and a signal processor,
   wherein the analog-digital converter is configured to convert the analog signal to a digital signal, comprises an output part for outputting the digital signal, and comprises a first reference voltage terminal separated from the output part,
   wherein the signal processor comprises an input part for receiving the digital signal and comprises a second reference voltage terminal separated from the input part,
   wherein the second reference voltage terminal is electrically connected to the first reference voltage terminal,
   wherein the second input terminal, the first reference voltage terminal, and the second reference voltage terminal receive a noise signal from the conductive layer,
   wherein the signal receiver uses the sensing signal and the noise signal to generate the analog signal,
   wherein each of the first reference voltage terminal and the second reference voltage terminal is electrically coupled to the ground terminal.

5. The display device according to claim 4, further comprising:
   a buffer electrically coupled between the conductive layer and the second input terminal, wherein each of the first reference voltage terminal and the second reference voltage terminal is electrically connected through an output terminal of the buffer to an inverting input terminal of the buffer.

6. The display device according to claim 1,
   wherein the conductive parts comprises a first conductive part, and a second conductive part,
   wherein the connection line comprises a first connection line section and a second connection line section,
   wherein the first conductive part overlaps the first electrode and is electrically insulated from the first electrode,
   wherein the first connection line section is lengthwise in a first direction, is positioned between the first conductive part and the second conductive part, is directly connected to each of the first conductive part and the second conductive part, and is narrower than each of the first conductive part and the second conductive part,
   wherein the second connection line section is lengthwise in a second direction different from the first direction, is positioned between the first conductive part and the second conductive part, and is electrically connected through the first connection line section to each of the first conductive part and the second conductive part, and wherein a maximum length of the second connection line section is greater than a maximum length of the first connection line section.

7. The display device according to claim 1, wherein the conductive parts and the connection line are formed of a same material and have a same thickness.

8. The display device according to claim 1, wherein the sensor unit comprises:
   a plurality of first-type electrodes including the first electrode;
   a plurality of first-type connectors electrically coupling the first-type electrodes;
   a plurality of second-type electrodes spaced from the first-type electrodes; and
   a plurality of second-type connectors electrically coupling the second-type electrodes, the second-type connectors respectively intersecting the first-type connectors.

9. The display device according to claim 8,
   wherein the sensor unit comprises an insulating layer,
   wherein the first-type electrodes, the first-type connectors, and the second-type electrodes directly contact a first face of the insulating layer, and
   wherein the second-type connectors and the conductive layer are spaced from each other, directly contact the insulating layer, and are spaced from the first face of the insulating layer.

10. The display device according to claim 8, wherein the conductive parts have edges slanted with respect to the connection line and respectively corresponding and parallel to edges of the first electrode.

11. The display device according to claim 1, further comprising:
    a power supply electrically connected to the touch driver and configured to supply a first voltage and a second voltage respectively to a first power terminal and a second power terminal of the touch driver.

12. The display device according to claim 11, wherein the second power terminal is electrically coupled to the second input terminal.

13. The display device according to claim 11, wherein the power supply comprises:
    a power input terminal;
    an inductor electrically coupled between the power input terminal and the first power terminal; and
    a capacitor having a first capacitor terminal and a second capacitor terminal respectively electrically connected to the first power terminal and the second power terminal.

14. The display device according to claim 11, wherein the power supply comprises:
    a power input terminal;
    a regulator integrated circuit electrically coupled between the power input terminal and the first power terminal, and including a reference voltage terminal electrically coupled to the second power terminal; and
    a capacitor electrically having a first capacitor terminal and a second capacitor terminal respectively electrically connected to the first power terminal and the second power terminal.

15. A touch sensor comprising:
    a sensor unit comprising a first electrode and a conductive layer, the conductive layer being spaced from the first electrode and overlapping the first electrode; and
    a touch driver comprising a signal receiver,
    wherein the signal receiver comprises a first input terminal electrically coupled to the first electrode, comprises a second input terminal electrically coupled to the conductive layer, is configured to receive a sensing signal from the sensor unit, and is configured to output a signal corresponding to a voltage difference between the first input terminal and the second input terminal; and
    wherein the conductive layer comprises a plurality of conductive parts overlapping the first electrode, arranged in at least two rows and at least two columns, and having a shape corresponding to the first electrode, and one or more connection lines integrally connected to the conductive parts to electrically connect all of the conductive parts to each other.

16. The touch sensor according to claim 15, wherein the touch driver comprises:
    a first power terminal configured to receive a first voltage; and
    a second power terminal configured to receive a second voltage,
    wherein the second power terminal is a ground terminal electrically coupled to the conductive layer.

17. The touch sensor according to claim 16, further comprising:
    a buffer electrically coupled between the conductive layer and the second input terminal,
    wherein a non-inverting input terminal of the buffer is electrically connected to the conductive layer, wherein the second input terminal of the signal receiver is electrically connected to an inverting input terminal of the buffer through an output terminal of the buffer,
    wherein the second power terminal is electrically coupled to the second input terminal and the output terminal of the buffer.

18. The touch sensor according to claim 15, wherein the sensor unit comprises:
    an insulating layer;
    a plurality of first-type electrodes including the first electrode and disposed directly on a first face of the insulating layer;
    a plurality of first-type connectors electrically coupling the first-type electrodes and disposed directly on the first face of the insulating layer;
    a plurality of second-type electrodes disposed directly on the first face of the insulating layer and spaced from the first-type electrodes; and
    a plurality of second-type connectors electrically coupling the second-type electrodes and spaced from the first face of the insulating layer.

19. The touch sensor according to claim 18,
    wherein the conductive parts are disposed directly on the insulating layer, are spaced from the first face of the insulating layer, overlap the first-type electrodes, and are spaced from the second-type connectors, and
    wherein the one or more connection lines are disposed directly on the insulating layer, are spaced from the first face of the insulating layer, and are spaced from the second-type connectors.

20. The touch sensor according to claim 18, wherein a material of the conductive layer is identical to a material of the second-type connectors, and wherein a thickness of the conductive layer is equal to a thickness of the second-type connectors in a direction perpendicular to the first face of the insulating layer.

* * * * *